United States Patent
Zeng et al.

(10) Patent No.: US 11,972,139 B2
(45) Date of Patent: Apr. 30, 2024

(54) READ VOLTAGE LEVEL CORRECTION METHOD, MEMORY STORAGE DEVICE, AND MEMORY CONTROL CIRCUIT UNIT

(71) Applicant: PHISON ELECTRONICS CORP., Miaoli (TW)

(72) Inventors: Shih-Jia Zeng, Hsinchu (TW); Chun-Wei Tsao, Taoyuan (TW); Hsiao-Yi Lin, Yilan County (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 185 days.

(21) Appl. No.: 17/679,109

(22) Filed: Feb. 24, 2022

(65) Prior Publication Data
US 2023/0214150 A1    Jul. 6, 2023

(30) Foreign Application Priority Data
Jan. 4, 2022  (TW) .................................. 111100226

(51) Int. Cl.
*G11C 16/26*   (2006.01)
*G06F 3/06*    (2006.01)
*G11C 29/02*   (2006.01)

(52) U.S. Cl.
CPC .......... *G06F 3/0655* (2013.01); *G06F 3/0604* (2013.01); *G06F 3/0679* (2013.01); *G11C 16/26* (2013.01); *G11C 29/021* (2013.01); *G11C 29/028* (2013.01)

(58) Field of Classification Search
CPC ..... G11C 16/26; G11C 29/021; G11C 29/028; G11C 2029/0409; G11C 2029/0411; G11C 29/42; G11C 11/5671; G11C 16/0483; G11C 2211/563; G06F 3/0655; G06F 3/0604; G06F 3/0679
See application file for complete search history.

(56) References Cited

U.S. PATENT DOCUMENTS

| | | | |
|---|---|---|---|
| 10,685,735 B1* | 6/2020 | Lin | G11C 16/349 |
| 11,386,965 B2* | 7/2022 | Lee | G11C 16/26 |
| 2008/0158984 A1* | 7/2008 | Mokhlesi | G11C 16/0483 365/185.21 |
| 2010/0110760 A1* | 5/2010 | Chen | G11C 13/004 365/189.15 |
| 2012/0084490 A1* | 4/2012 | Choi | G11C 16/349 711/E12.008 |
| 2017/0271020 A1* | 9/2017 | Zeng | G11C 16/3495 |
| 2018/0350441 A1* | 12/2018 | Kim | G06F 11/1012 |
| 2019/0095135 A1* | 3/2019 | Hsiao | G11C 29/028 |
| 2020/0098413 A1* | 3/2020 | Bedeschi | G11C 11/2257 |
| 2022/0051745 A1* | 2/2022 | You | G11C 7/14 |
| 2023/0044073 A1* | 2/2023 | Kim | G11C 16/3459 |

* cited by examiner

*Primary Examiner* — Khamdan N. Alrobaie
(74) *Attorney, Agent, or Firm* — JCIPRNET

(57) ABSTRACT

A read voltage level correction method, a memory storage device, and a memory control circuit unit are provided. The method includes: using a first read voltage level as an initial read voltage level to perform a first data read operation on a first physical unit among multiple physical units to obtain a second read voltage level used to successfully read the first physical unit; recording association information between the first read voltage level and the second read voltage level in a transient look-up table; and performing a second data read operation according to a read level tracking table and the association information recorded in the transient look-up table.

18 Claims, 5 Drawing Sheets

READ VOLTAGE LEVEL CORRECTION METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 111100226, filed on Jan. 4, 2022. The entirety of the above-mentioned patent application is hereby incorporated by reference herein and made a part of this specification.

BACKGROUND

Technical Field

The disclosure relates to a read voltage level tracking method, and more particularly to a read voltage level correction method for a rewritable non-volatile memory module, a memory storage device, and a memory control circuit unit.

Description of Related Art

Portable electronic devices such as mobile phones and notebook computers have grown rapidly in the past few years, which has led to a rapid increase in consumer demand for storage media. As the rewritable non-volatile memory module (for example, a flash memory) has characteristics such as non-volatile data, power saving, small size, no mechanical structure, and fast read and write speed, the rewritable non-volatile memory module is very suitable for being built into the various portable electronic devices exemplified above. A solid state drive is a memory storage device that uses a flash memory module as a storage medium. Therefore, in recent years, the flash memory industry has become a very popular part of the electronics industry.

When reading data, the memory storage device reads the data according to a preset read voltage level. However, as the operating and environmental conditions of the memory module in the memory storage device change, the threshold voltage of the memory module also shifts accordingly. In this case, there may be too many error bits in the data read using the preset read voltage level. Generally, the memory storage device finds the optimal read voltage level by performing the optimal read voltage level tracking operation.

In the optimal read voltage level tracking operation, the memory storage device continuously monitors and records the optimal read voltage level of the memory module. However, the current operating and environmental conditions (for example, temperature) when the memory storage device actually reads the data may be different from the conditions when previously monitoring the optimal read voltage level. Alternatively, the memory storage device may not be able to continuously monitor the optimal read voltage level because the host system is powered off or enters a low power consumption mode, resulting in an excessively long interval between the actual data reading time and the previous monitoring time. With the different operating and environmental conditions and the passage of time, the optimal read voltage level of the memory module may shift again, causing the previously found optimal read voltage level to be invalid. Directly using the previous monitoring result may instead cause poor efficacy of the read operation.

SUMMARY

The disclosure provides a read voltage level correction method, a memory storage device, and a memory control circuit unit, which can reduce the time for finding a read voltage level that may successfully read a physical unit, thereby increasing the overall efficacy of a data read operation.

The disclosure provides a read voltage level correction method for a rewritable non-volatile memory module. The rewritable non-volatile memory module includes multiple physical units. The method includes the following steps. A first read voltage level is used as an initial read voltage level to perform a first data read operation on a first physical unit among the physical units to obtain a second read voltage level used to successfully read the first physical unit. Association information between the first read voltage level and the second read voltage level is recorded in a transient look-up table. A second data read operation is performed according to a read level tracking table and the association information recorded in the transient look-up table. The read level tracking table records multiple optimal read voltage levels of the physical units.

In an embodiment of the disclosure, the step of using the first read voltage level as the initial read voltage level to perform the first data read operation on the first physical unit among the physical units further includes the following step. A first optimal read voltage level corresponding to the first physical unit is obtained from the read level tracking table as the first read voltage level.

In an embodiment of the disclosure, the step of using the first read voltage level as the initial read voltage level to perform the first data read operation on the first physical unit among the physical units further includes the following step. The first read voltage level is determined according to the read level tracking table and the association information recorded in the transient look-up table.

In an embodiment of the disclosure, the method includes the following step. A decoding operation is performed when using the first read voltage level as the initial read voltage level to perform the first data read operation on the first physical unit among the physical units or performing the second data read operation according to the read level tracking table and the association information recorded in the transient look-up table.

In an embodiment of the disclosure, the step of recording the association information between the first read voltage level and the second read voltage level in the transient look-up table includes the following steps. A number of times that the first read voltage level and the second read voltage level are associated is counted to generate a count value. The count value is recorded in the transient look-up table.

In an embodiment of the disclosure, the step of performing the second data read operation according to the read level tracking table and the association information recorded in the transient look-up table includes the following steps. When the second data read operation instructs to read data of a second physical unit among the physical units, a second optimal read voltage level of the second physical unit is obtained from the read level tracking table. The transient look-up table is looked up according to the second optimal read voltage level or an index corresponding to the second optimal read voltage level to sequentially obtain the second read voltage level corresponding to the count value as an initial read voltage level for performing the second data read operation according to a sequence of multiple count values from large to small.

In an embodiment of the disclosure, the method further includes the following step. The read level tracking table is updated according to the association information recorded in the transient look-up table. The transient look-up table is cleared after updating the read level tracking table.

The disclosure provides a memory storage device, which includes a connection interface unit, a rewritable non-volatile memory module, and a memory control circuit unit. The connection interface unit is configured to couple to a host system. The rewritable non-volatile memory module includes multiple physical units. The memory control circuit unit is coupled to the connection interface unit and the rewritable non-volatile memory module. The memory control circuit unit is configured to use a first read voltage level as an initial read voltage level to perform a first data read operation on a first physical unit among the physical units to obtain a second read voltage level used to successfully read the first physical unit. The memory control circuit unit is further configured to record association information between the first read voltage level and the second read voltage level in a transient look-up table. In addition, the memory control circuit unit is further configured to perform a second data read operation according to a read level tracking table and the association information recorded in the transient look-up table. The read level tracking table records multiple optimal read voltage levels of the physical units.

In an embodiment of the disclosure, the memory control circuit unit is further configured to obtain a first optimal read voltage level corresponding to the first physical unit from the read level tracking table as the first read voltage level.

In an embodiment of the disclosure, the memory control circuit unit is further configured to determine the first read voltage level according to the read level tracking table and the association information recorded in the transient look-up table.

In an embodiment of the disclosure, the memory control circuit unit is further configured to perform a decoding operation when using the first read voltage level as the initial read voltage level to perform the first data read operation on the first physical unit among the physical units or performing the second data read operation according to the read level tracking table and the association information recorded in the transient look-up table.

In an embodiment of the disclosure, in the operation of recording the association information between the first read voltage level and the second read voltage level in the transient look-up table, the memory control circuit unit is further configured to count a number of times that the first read voltage level and the second read voltage level are associated to generate a count value. In addition, the memory control circuit unit is further configured to record the count value in the transient look-up table.

In an embodiment of the disclosure, in the operation of performing the second data read operation according to the read level tracking table and the association information recorded in the transient look-up table, the memory control circuit unit is further configured to obtain a second optimal read voltage level of a second physical unit among the physical units from the read level tracking table when the second data read operation instructs to read data of the second physical unit. In addition, the memory control circuit unit is further configured to look up the transient look-up table according to the second optimal read voltage level or an index corresponding to the second optimal read voltage level to sequentially obtain the second read voltage level corresponding to the count value as an initial read voltage level for performing the second data read operation according to a sequence of multiple count values from large to small.

In an embodiment of the disclosure, the memory control circuit unit is further configured to update the read level tracking table according to the association information recorded in the transient look-up table. In addition, the memory control circuit unit is further configured to clear the transient look-up table after updating the read level tracking table.

The disclosure provides a memory control circuit unit for controlling a rewritable non-volatile memory module including multiple physical units. The memory control circuit unit includes a host interface, a memory interface, an error detecting and correcting circuit, and a memory management circuit. The host interface is configured to couple to a host system. The memory interface is configured to couple to the rewritable non-volatile memory module. The memory management circuit is coupled to the host interface, the memory interface, and the error detecting and correcting circuit. The memory management circuit is configured to use a first read voltage level as an initial read voltage level to perform a first data read operation on a first physical unit among the physical units to obtain a second read voltage level used to successfully read the first physical unit. The memory management circuit is further configured to record association information between the first read voltage level and the second read voltage level in a transient look-up table. In addition, the memory management circuit is further configured to perform a second data read operation according to a read level tracking table and the association information recorded in the transient look-up table. The read level tracking table records multiple optimal read voltage levels of the physical units.

In an embodiment of the disclosure, the memory management circuit is further configured to obtain a first optimal read voltage level corresponding to the first physical unit from the read level tracking table as the first read voltage level.

In an embodiment of the disclosure, the memory management circuit is further configured to determine the first read voltage level according to the read level tracking table and the association information recorded in the transient look-up table.

In an embodiment of the disclosure, the memory management circuit is further configured to perform a decoding operation when using the first read voltage level as the initial read voltage level to perform the first data read operation on the first physical unit among the physical units or performing the second data read operation according to the read level tracking table and the association information recorded in the transient look-up table.

In an embodiment of the disclosure, in the operation of recording the association information between the first read voltage level and the second read voltage level in the transient look-up table, the memory management circuit is further configured to count a number of times that the first read voltage level and the second read voltage level are associated to generate a count value. In addition, the memory management circuit is further configured to record the count value in the transient look-up table.

In an embodiment of the disclosure, in the operation of performing the second data read operation according to the read level tracking table and the association information recorded in the transient look-up table, the memory management circuit is further configured to obtain a second optimal read voltage level of a second physical unit among the physical units from the read level tracking table when the second data read operation instructs to read data of the second physical unit. In addition, the memory management circuit unit is further configured to look up the transient look-up table according to the second optimal read voltage level or an index corresponding to the second optimal read voltage level to sequentially obtain the second read voltage level corresponding to the count value as an initial read voltage level for performing the second data read operation according to a sequence of multiple count values from large to small.

In an embodiment of the disclosure, the memory management circuit is further configured to update the read level tracking table according to the association information recorded in the transient look-up table. Moreover, the memory management circuit is further configured to clear the transient look-up table after updating the read level tracking table.

Based on the above, in the read voltage level correction method, the memory storage device, and the memory control circuit unit provided by the embodiments of the disclosure, the association information can be recorded in the transient look-up table, and the previously monitored optimal read voltage level can be fine-tuned according to the association information recorded in the transient look-up table. Compared with generally only using the previously monitored optimal read voltage level to perform operations such as an optimal read level search operation and the decoding operation, the disclosure can reduce the time for finding the read voltage level that may successfully read the physical unit, thereby increasing the overall efficacy of the data read operation.

In order for the features and advantages of the disclosure to be more comprehensible, the following specific embodiments are described in detail in conjunction with the drawings.

DETAILED DESCRIPTION OF DISCLOSED EMBODIMENTS

Generally speaking, a memory storage device (also referred to as a memory storage system) includes a rewritable non-volatile memory module and a controller (also referred to as a control circuit). The memory storage device may be used together with a host system, so that the host system may write data to the memory storage device or read data from the memory storage device.

Figure 1:
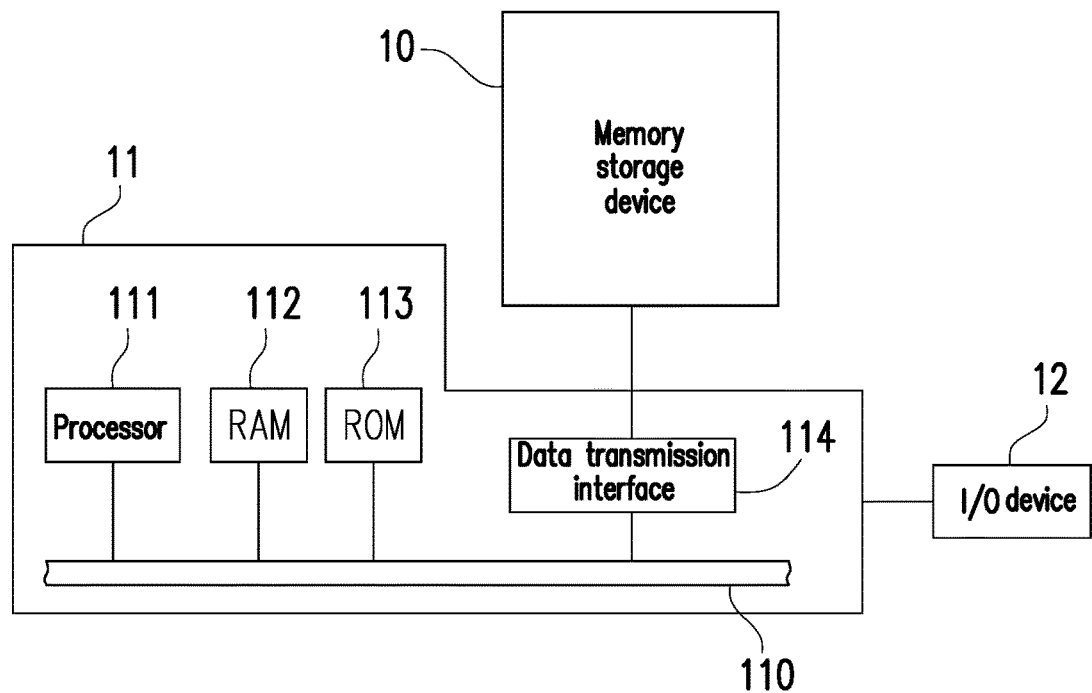
FIG. 1 is a schematic diagram of a host system, a memory storage device, and an input/output (I/O) device according to an exemplary embodiment of the disclosure.
Figure 2:
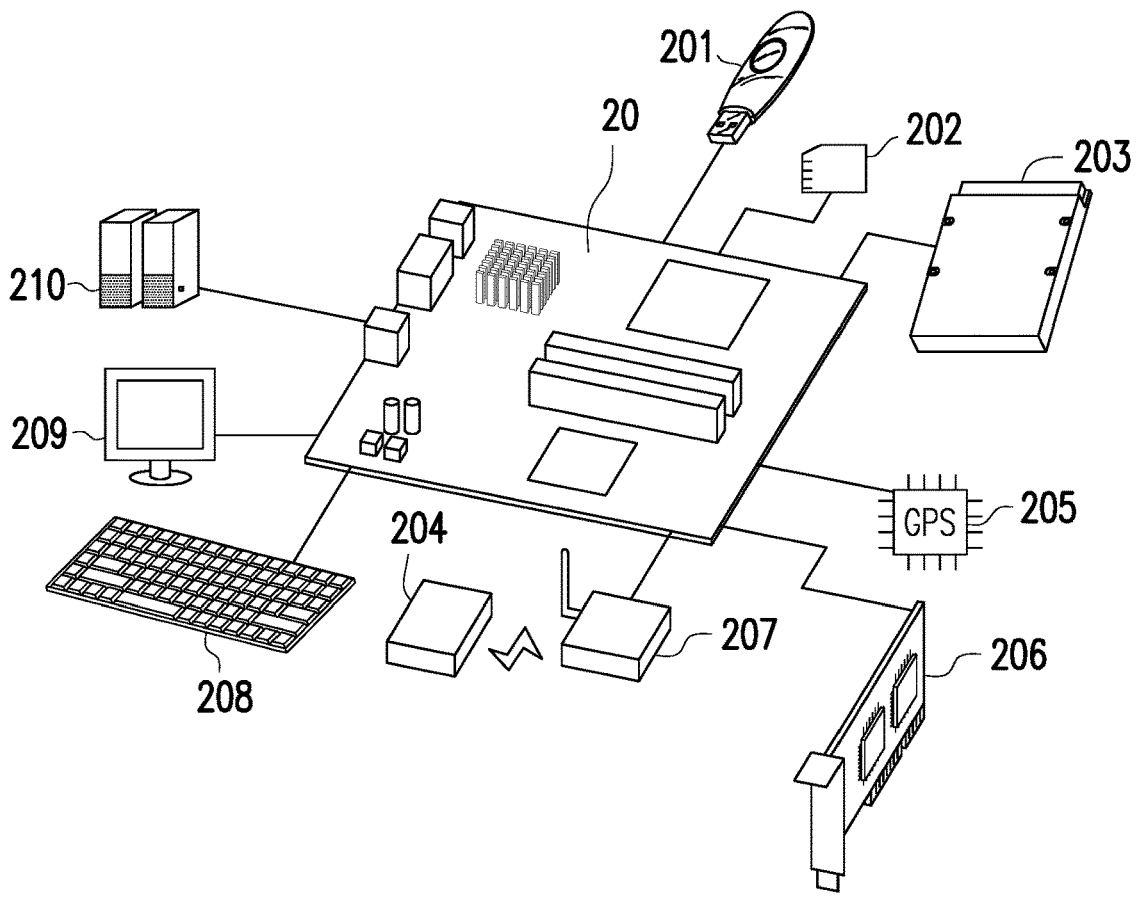
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

Please refer to FIG. 1 and FIG. 2. A host system 11 generally includes a processor 111, a random access memory (RAM) 112, a read only memory (ROM) 113, and a data transmission interface 114. The processor 111, the random access memory 112, the read only memory 113, and the data transmission interface 114 may all be coupled to a system bus 110.

In the exemplary embodiment, the host system 11 is coupled to the memory storage device 10 through the data transmission interface 114. For example, the host system 11 may store data to the memory storage device 10 or read data from the memory storage device 10 via the data transmission interface 114. In addition, the host system 11 may be coupled to the I/O device 12 through the system bus 110. For example, the host system 11 may send an output signal to the I/O device 12 or receive an input signal from the I/O device 12 via the system bus 110.

In the exemplary embodiment, the processor 111, the random access memory 112, the read only memory 113, and the data transmission interface 114 may be disposed on a motherboard 20 of the host system 11. The number of the data transmission interface 114 may be one or more. Through the data transmission interface 114, the motherboard 20 may be coupled to the memory storage device 10 via a wired or wireless manner. The memory storage device 10 may be, for example, a flash drive 201, a memory card 202, a solid state drive (SSD) 203, or a wireless memory storage device 204. The wireless memory storage device 204 may be, for example, a near field communication (NFC) memory storage device, a Wi-Fi memory storage device, a Bluetooth memory storage device, a low-power Bluetooth memory storage device (for example, iBeacon), or other memory storage devices based on various wireless communication technologies. In addition, the motherboard 20 may also be coupled to a global positioning system (GPS) module 205, a network interface card 206, a wireless transmission device 207, a keyboard 208, a screen 209, a speaker 210, or various other I/O devices through the system bus 110. For example, in an exemplary embodiment, the motherboard 20 may access the wireless memory storage device 204 through the wireless transmission device 207.

Figure 3:
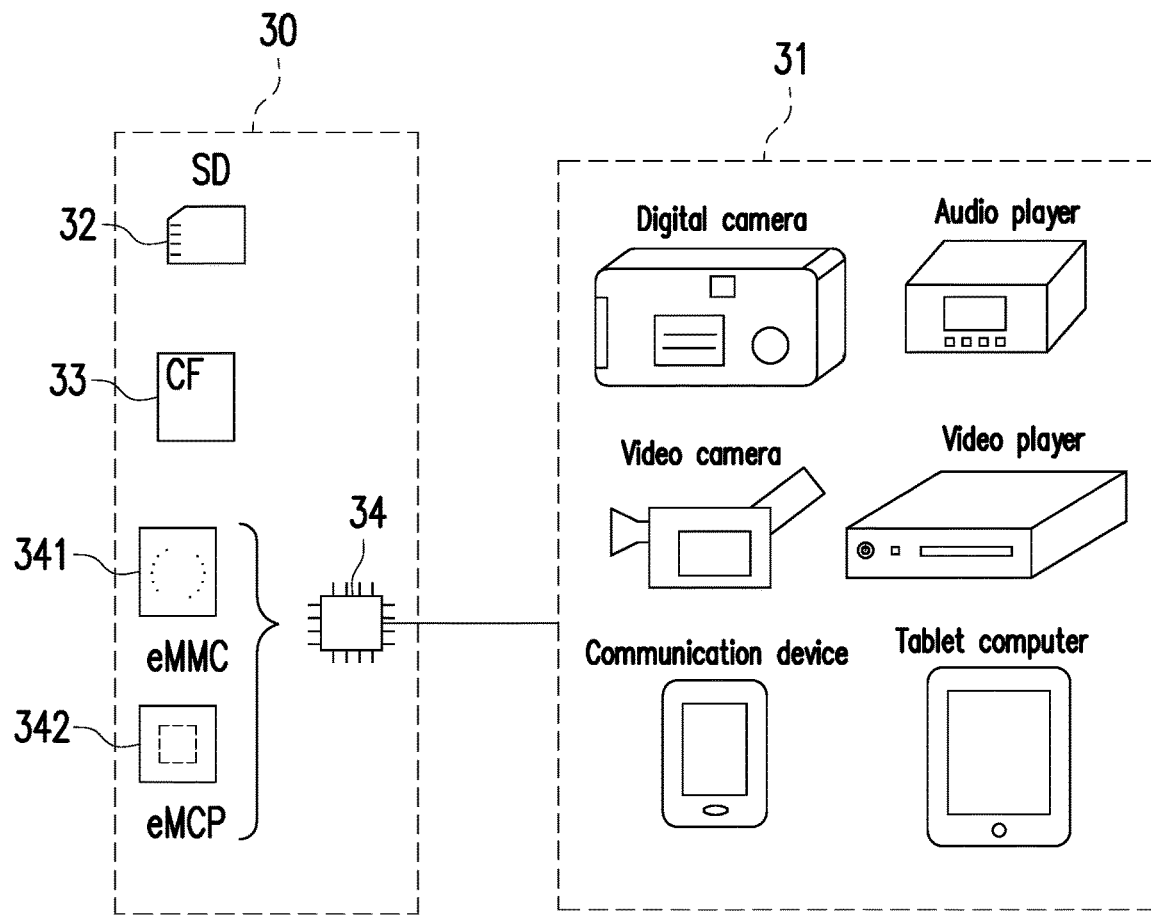
FIG. 3 is a schematic diagram of a host system and a memory storage device according to another exemplary embodiment of the disclosure.

In an exemplary embodiment, the host system may be any system that may substantially cooperate with a memory storage device to store data. Although in the above exemplary embodiment, the host system is described as a computer system, FIG. 3 is a schematic diagram of a host system and a memory storage device according to another exemplary embodiment of the disclosure. Please refer to FIG. 3. In another exemplary embodiment, a host system 31 may also be a digital camera, a video camera, a communication device, an audio player, a video player, a tablet computer, or other systems, and the memory storage device 30 may be a secure digital (SD) card 32, a compact flash (CF) card 33, an embedded storage device 34, or various other non-volatile memory storage devices used by the host system 31. The embedded storage device 34 includes an embedded multi media card (eMMC) 341, an embedded multi chip package (eMCP) storage device 342, and/or various other embedded storage devices in which a memory module is directly coupled onto a substrate of a host system.

Figure 4:
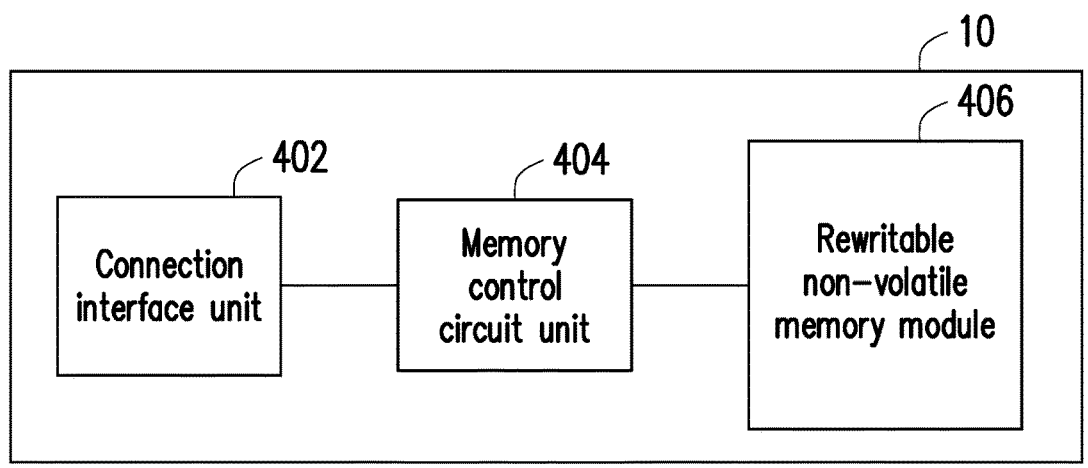
FIG. 4 is a schematic block diagram of a memory storage device according to an exemplary embodiment of the disclosure.

FIG. 4 is a schematic block diagram of a memory storage device according to an exemplary embodiment of the disclosure. Please refer to FIG. 4. The memory storage device 10 includes a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 through the connection interface unit 402. In the exemplary embodiment, the connection interface unit 402 is compatible with the serial advanced technology attachment (SATA) standard. However, it must be understood that the disclosure is not limited thereto. The connection interface unit 402 may also conform to the parallel advanced technology attachment (PATA) standard, the Institute of Electrical and Electronic Engineers (IEEE) 1394 standard, the high-speed peripheral component interconnect express (PCI express) standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 402 and the memory control circuit unit 404 may be packaged in one chip or the connection interface unit 402 may be arranged outside a chip containing the memory control circuit unit 404.

The memory control circuit unit 404 is configured to perform multiple logic gates or control commands implemented in the form of hardware or the form of firmware and perform operations such as data writing, reading, and erasing in the rewritable non-volatile memory module 406 according to a command of the host system 11.

The rewritable non-volatile memory module 406 is coupled to the memory control circuit unit 404 and is configured to store the data written by the host system 11. The rewritable non-volatile memory module 406 may be a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristic.

Each memory cell in the rewritable non-volatile memory module 406 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data to the memory cell" or "programming the memory cell". As the threshold voltage changes, each memory cell in the rewritable non-volatile memory module 406 has multiple storage states. Through applying a read voltage, it is possible to judge which storage state a memory cell belongs to, thereby obtaining one or more bits stored in the memory cell.

In the exemplary embodiment, the memory cells of the rewritable non-volatile memory module 406 may constitute multiple physical programming units, and the physical programming units may constitute multiple physical erasing units. Specifically, the memory cells on the same word line may form one or more physical programming units. If each memory cell may store more than 2 bits, the physical programming units on the same word line may be classified into at least a lower physical programming unit and an upper physical programming unit. For example, a least significant bit (LSB) of a memory cell belongs to the lower physical programming unit and a most significant bit (MSB) of a memory cell belongs to the upper physical programming unit. Generally speaking, in an MLC NAND flash memory, the data write speed of the lower physical programming unit is greater than the data write speed of the upper physical programming unit and/or the reliability of the lower physical programming unit is higher than the reliability of the upper physical programming unit.

In the exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area contains multiple physical sectors for storing user data, and the redundancy bit area is configured to store system data (for example, management data such as an error correcting code). In the exemplary embodiment, the data bit area contains 32 physical sectors, and the size of one physical sector is 512 bytes (B). However, in other exemplary embodiments, the data bit area may also contain 8, 16, more, or less physical sectors, and the size of each physical sector may also be greater or smaller. On the other hand, the physical erasing unit is the smallest unit of erasure. That is, each physical erasing unit contains the smallest number of memory cells to be erased together. For example, the physical erasing unit is a physical block.

Figure 5:
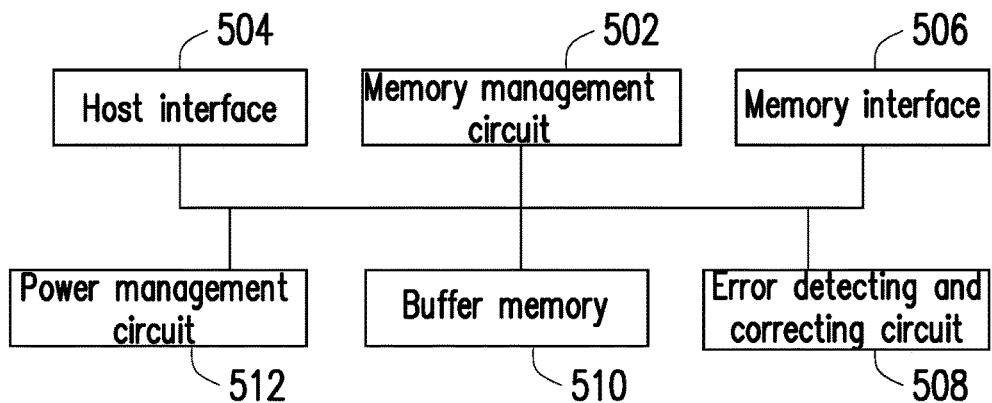
FIG. 5 is a schematic block diagram of a memory control circuit unit according to an exemplary embodiment of the disclosure.

FIG. 5 is a schematic block diagram of a memory control circuit unit according to an exemplary embodiment of the disclosure. Please refer to FIG. 5. The memory control circuit unit 404 includes a memory management circuit 502, a host interface 504, and a memory interface 506.

The memory management circuit 502 is configured to control the overall operation of the memory control circuit unit 404. Specifically, the memory management circuit 502 has multiple control commands, and when the memory storage device 10 is operating, the control commands are performed to perform operations such as data writing, reading, and erasing. The following description of the operation of the memory management circuit 502 is equivalent to the description of the operation of the memory control circuit unit 404.

In the exemplary embodiment, the control commands of the memory management circuit 502 are implemented in the form of firmware. For example, the memory management circuit 502 has a microprocessor unit (not shown) and a read only memory (not shown), and the control commands are burnt into the read only memory. When the memory storage device 10 is operating, the control commands are performed by the microprocessor unit to perform operations such as data writing, reading, and erasing.

In another exemplary embodiment, the control commands of the memory management circuit 502 may also be stored in a specific area (for example, a system area dedicated to storing system data in a memory module) of the rewritable non-volatile memory module 406 in the form of program codes. In addition, the memory management circuit 502 has a microprocessor unit (not shown), a read only memory (not shown), and a random access memory (not shown). In particular, the read only memory has a boot code, and when the memory control circuit unit 404 is enabled, the microprocessor unit first performs the boot code to load the control commands stored in the rewritable non-volatile memory module 406 into the random access memory of the memory management circuit 502. After that, the microprocessor unit runs the control commands to perform operations such as data writing, reading, and erasing.

In addition, in another exemplary embodiment, the control commands of the memory management circuit 502 may also be implemented in the form of hardware. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage a memory cell or a memory cell group of the rewritable non-volatile memory module 406. The memory write circuit is configured to issue a write command sequence to the rewritable non-volatile memory module 406 to write data to the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence, and the erase command sequence may each include one or more program codes or command codes and are configured to instruct the rewritable non-volatile memory module 406 to perform corresponding operations such as writing, reading, and erasing. In an exemplary embodiment, the memory management circuit 502 may also issue other types of command sequences to the rewritable non-volatile memory module 406 to instruct to perform corresponding operations.

The host interface 504 is coupled to the memory management circuit 502. The memory management circuit 502 may communicate with the host system 11 through the host interface 504. The host interface 504 may be configured to receive and identify commands and data sent by the host system 11. For example, the commands and the data sent by the host system 11 may be sent to the memory management circuit 502 through the host interface 504. In addition, the memory management circuit 502 may send the data to the host system 11 through the host interface 504. In the exemplary embodiment, the host interface 504 is compatible with the SATA standard. However, it must be understood that the disclosure is not limited thereto. The host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and is configured to access the rewritable non-volatile memory module 406. In other words, the data to be written to the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 will send corresponding command sequences. For example, the command sequences may include the write command sequence instructing to write data, the read command sequence instructing to read data, the erase command sequence instructing to erase data, and corresponding command sequences instructing various memory operations (for example, changing a read voltage level, performing a garbage collection operation, etc.). The command sequences are, for example, generated by the memory management circuit 502 and sent to the rewritable non-volatile memory module 406 through the memory interface 506. The command sequences may include one or more signals, or data on a bus. The signals or the data may include command codes or program codes. For example, the read command sequence includes information such as a read recognition code and a memory address.

In an exemplary embodiment, the memory control circuit unit 404 further includes error detecting and correcting circuit 508, a buffer memory 510, and a power management circuit 512.

The error detecting and correcting circuit 508 is coupled to the memory management circuit 502 and is configured to perform error detecting and correcting operations to ensure the correctness of the data. Specifically, when the memory management circuit 502 receives the write command from the host system 11, the error detecting and correcting circuit 508 generates a corresponding error correcting code (ECC) and/or error detecting code (EDC) for the data corresponding to the write command, and the memory management circuit 502 writes the data corresponding to the write command and the corresponding ECC and/or EDC to the rewritable non-volatile memory module 406. Later, when the memory management circuit 502 reads the data from the rewritable non-volatile memory module 406, the ECC and/or EDC corresponding to the data are also simultaneously read, and the error detecting and correcting circuit 508 performs the error detecting and correcting operations on the read data according to the ECC and/or the EDC.

The buffer memory 510 is coupled to the memory management circuit 502 and is configured to temporarily store the data and the command from the host system 11 or the data from the rewritable non-volatile memory module 406. The buffer memory 510 may be a static random access memory (SRAM), a dynamic random access memory (DRAM), etc., which is not limited in the disclosure. The power management circuit 512 is coupled to the memory management circuit 502 and is configured to control the power of the memory storage device 10.

In an exemplary embodiment, the rewritable non-volatile memory module 406 of FIG. 4 is also referred to as a flash memory module, and the memory control circuit unit 404 is also referred to as a flash memory controller for controlling the flash memory module. In an exemplary embodiment, the memory management circuit 502 of FIG. 5 is also referred to as a flash memory management circuit.

Figure 6:
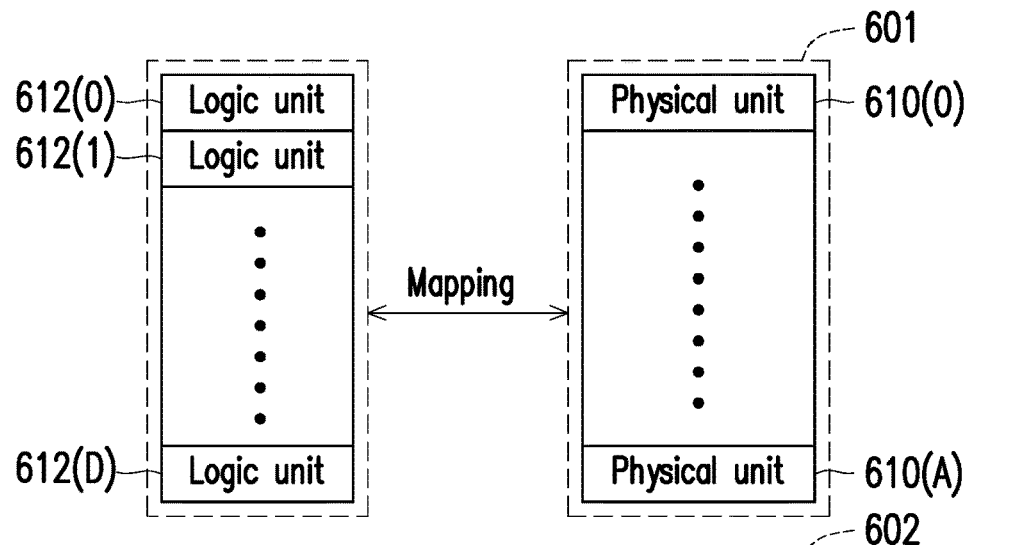
FIG. 6 is a schematic diagram of managing a rewritable non-volatile memory module according to an exemplary embodiment of the disclosure.
Figure 6:
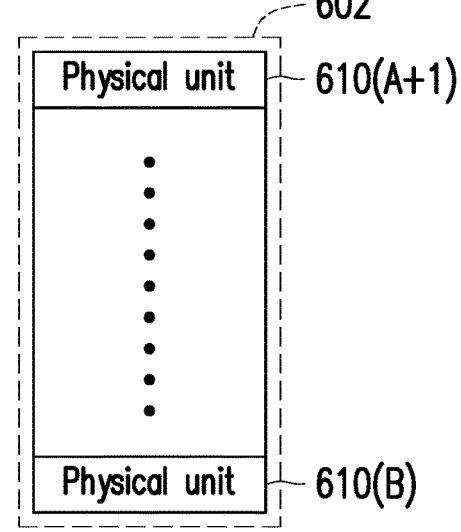

FIG. 6 is a schematic diagram of managing a rewritable non-volatile memory module according to an exemplary embodiment of the disclosure. Please refer to FIG. 6. The memory management circuit 502 may logically group physical units 610(0) to 610(B) of the rewritable non-volatile memory module 406 into a storage area 601 and a spare area 602. The physical units 610(0) to 610(A) in the storage area 601 and the physical units 610(A+1) to 610(B) in the spare area 602 are configured to store the data from the host system 11. Specifically, the physical unit of the storage area 601 is regarded as a physical unit stored with data, and the physical unit of the spare area 602 is configured to replace the physical unit of the storage area 601. In other words, when receiving the write command and the data to be written from the host system 11, the memory management circuit 502 uses the physical unit extracted from the spare area 602 to write the data to replace the physical unit of the storage area 601.

In the exemplary embodiment, each physical unit refers to a physical erasing unit. However, in another exemplary embodiment, a physical unit may also refer to a physical address, a physical programming unit, or be composed of multiple continuous or discontinuous physical addresses. The memory management circuit 502 is configured with logic units 612(0) to 612(C) to map the physical units 610(0) to 610(A) in the storage area 601. In the exemplary embodiment, each logic unit refers to a logic address. However, in another exemplary embodiment, a logic unit may also refer to a logic programming unit, a logic erasing unit, or be composed of multiple continuous or discontinuous logic addresses. Additionally, each of the logic units 612(0) to 612(C) may be mapped to one or more physical units.

The memory management circuit 502 may record a mapping relationship between the logic unit and the physical unit (also referred to as a logical-physical address mapping relationship) in at least one logical-physical address mapping table. When the host system 11 intends to read data from the memory storage device 10 or write data to the memory storage device 10, the memory management circuit 502 may perform a data access operation on the memory storage device 10 according to the logical-physical address mapping table.

In an exemplary embodiment, the memory storage device 10 supports error correction, and the data is encoded and then stored in the rewritable non-volatile memory module 406. When the physical units are to be read, the memory management circuit 502 first selects a preset read voltage level to read the memory cells included in the physical units to obtain verification bits (bits 0 or 1) of the memory cells. The error detecting and correcting circuit 508 performs a decoding operation according to the verification bits of the memory cells to generate multiple decoded bits. The decoded bits may form decoded data (that is, a codeword). In an exemplary embodiment, the memory management circuit 502 judges whether the data is a valid codeword according to a syndrome corresponding to the data. If the data is not a valid codeword, the memory management circuit 702 will judge that the decoding fails.

If the decoding fails, it means that the memory cells are stored with an uncorrectable error bit. In the exemplary embodiment, the memory management circuit 502 reobtains another read voltage level adjacent to the previous read voltage level to read the memory cells, so as to reobtain the verification bits of the memory cells. The memory management circuit 502 performs the decoding operation according to the reobtained verification bits to obtain another data composed of multiple decoded bits. If the decoding fails again, the memory management circuit 502 will reobtain another read voltage level to read the memory cells. In an exemplary embodiment, the memory management circuit 502 may reobtain the read voltage level to attempt the decoding until the decoding is successful or the number of times of reobtaining the read voltage level exceeds a preset number of times. In other words, when there is an uncorrectable error bit, through reobtaining the read voltage level, the verification bits of some memory cells will be changed, thereby having a chance to change the decoding result of the decoding operation.

By the re-reading mechanism, the optimal read voltage level of the physical unit may be found, and the optimal read voltage level may be used to read the data of the physical unit and decode successfully. The operation of finding the optimal read voltage level of the optimal read physical unit may be referred to as an "optimal read level search operation", which may be performed when the rewritable non-volatile memory module 406 is spare (or referred to as being in a background mode) or after failing to perform hard-bit mode decoding. Alternatively, during a process of performing the hard-bit mode decoding (for example, obtaining the read voltage with the least number of error bits), the optimal read voltage level of the physical unit may be found. The determined optimal read voltage level may be used for subsequent reading of the rewritable non-volatile memory module 406.

It should be noted that when the data read operation is to be performed to read the physical unit in the rewritable non-volatile memory module 406 according to the read command received from the host system 11 or as required in the background mode, the memory management circuit 502 first uses the preset read voltage level to read the memory cell included in the physical unit. In addition, the memory management circuit 502 may use the data obtained by the preset read voltage level to perform the hard-bit mode decoding and soft-bit mode decoding or use encoded data generated by multi-frame encoding to perform the decoding, and the disclosure is not limited to the decoding manners. The detailed execution processes of the hard-bit mode decoding, the soft-bit mode decoding, or multi-frame encoding and decoding may be known from the prior art which will not be repeated. If the decoding of the data using the hard bit mode decoding or the soft bit mode decoding fails, the memory management circuit 502 may reobtain another read voltage level adjacent to the preset read voltage level to read the memory cell included in the physical unit, so as to reobtain the data and perform the decoding. If the decoding is successful, it means that the current read voltage level may be used to read the data of the physical unit and decode successfully.

In other words, the memory management circuit 502 may use an initial read voltage level (for example, a first read voltage level) when performing the data read operation, such as performing the optimal read level search operation and various decoding operations (for example, the hard-bit mode decoding and the soft-bit mode decoding), and obtain the read voltage level (also referred to as a second read voltage level) that may be used to read the data of the physical unit and decode successfully according to the operation result of the above operation. In other words, the memory management circuit 502 may obtain the second read voltage level used to successfully read the physical unit via the above operation.

In the exemplary embodiment, the memory management circuit 502 may use the first read voltage level as the initial read voltage level to perform the data read operation on a first physical unit among the physical units to obtain the second read voltage level used to successfully read the first physical unit. For example, the memory management circuit 502 may perform the decoding operation to obtain the second read voltage level when performing the read operation, which is not limited in the disclosure.

In the exemplary embodiment, the memory management circuit 502 records association information between the first read voltage level and the second read voltage level in a transient look-up table. For example, the association information includes a count value of the number of times that the first read voltage level and the second read voltage level are associated. Specifically, the memory management circuit 502 may count the number of times that the first read voltage level and the second read voltage level are associated to generate the count value, and record the count value in the transient look-up table. For example, Table 1 below is the transient look-up table in an exemplary embodiment, which records the association information between the first read voltage level and the second read voltage level.

TABLE 1

|  | Read voltage level a1 | Read voltage level a2 |
|---|---|---|
| Read voltage level b1 | 1 | 0 |
| Read voltage level b2 | 0 | 0 |

In Table 1, the read voltage level a1 and the read voltage level a2 represent the first read voltage level, and the read voltage level b1 and the read voltage level b2 represent the second read voltage level. According to Table 1, the memory management circuit 502 uses the read voltage level a1 as the initial read voltage level to perform the data read operation on the physical unit, and then obtains the read voltage level b1 used to successfully read the physical unit bit. In the exemplary embodiment, the memory management circuit 502 counts the number of times that the read voltage level a1 and the read voltage level b2 are associated to generate the count value. For example, in Table 1, the count value recorded in the field corresponding to the read voltage level a1 and the read voltage level b1 is 1, which means that the number of times that the read voltage level a1 and the read voltage level b1 are associated is once. However, Table 1 is only an example, and specific records may be adjusted according to practical requirements.

In an exemplary embodiment, it is assumed that the rewritable non-volatile memory module 406 is an MLC NAND flash memory module. When the physical units included in the MLC NAND flash memory module are stored with data, each physical unit corresponds to three threshold voltages. Specifically, each memory cell of the MLC NAND flash memory module may store 2 units, and the physical programming units on the same word line may be at least classified into the lower physical programming unit and the upper physical programming unit. In the exemplary embodiment, the lower physical programming unit corresponds to one of the three threshold voltages, and the upper physical programming unit corresponds to two of the three threshold voltages. Therefore, when the rewritable non-volatile memory module 406 is the MLC NAND flash memory module, the memory management circuit 502 records three read voltage levels for each physical unit, and the read voltage levels may be referred to as a "read voltage level group". In other words, when the physical programming unit read by the memory management circuit 502 is the upper physical programming unit, the first read voltage level as the initial read voltage level may include multiple read voltage levels, and the second read voltage level obtained after performing the data read operation may include multiple read voltage levels. It is worth noting that the number of read voltage levels included in the first read voltage level and the second read voltage level changes according to the type of the rewritable non-volatile memory module 406, which is not limited in the disclosure.

In the exemplary embodiment, the memory management circuit 502 may assign an index to the physical units of the same voltage level group to save storage space when recording the read voltage level group (for example, an optimal read voltage level group) of each physical unit. Specifically, the memory management circuit 502 may establish a physical unit index comparison table and an index look-up table, and may respectively establish the index look-up table for the physical programming units belonging to different valid bits of the memory cells. For example, Table 2 below is an example of the physical unit index comparison table in an exemplary embodiment, which is used to record a corresponding relationship between the physical unit and the index. Table 3 below is an example of the index look-up table in an exemplary embodiment, which is used to record a corresponding relationship between the index and the read voltage level of the upper physical programming unit. Table 4 below is an example of the index look-up table in an exemplary embodiment, which is used to record a corresponding relationship between the index and the read voltage level of the lower physical programming unit.

TABLE 2

| Physical unit | Index |
|---|---|
| 610(0) | RRT1 |
| 610(1) | RRT2 |
| 610(2) | RRT3 |
| 610(3) | RRT4 |
| 610(4) | RRT3 |

TABLE 3

| Index | Read voltage level c1 | Read voltage level c3 |
|---|---|---|
| RRT1 | 14 V | 23 V |
| RRT2 | 11 V | 21 V |
| RRT3 | −2 V | 4 V |
| RRT4 | −9 V | −6 V |

TABLE 4

| Index | Read voltage level c2 |
|---|---|
| RRT1 | 5 V |
| RRT2 | 10 V |
| RRT3 | −6 V |
| RRT4 | −9 V |

Specifically, the memory management circuit 502 may assign the index RRT1 to the physical unit 610(0) when recording the read voltage level group of the physical unit 610(0). The memory management circuit 502 records the index RRT1 corresponding to the physical unit 610(0) in the physical unit index comparison table (the physical unit 610(0) and the corresponding index RRT1 shown in Table 2), records the read voltage levels c1 and c3 of the upper physical programming unit of the physical unit 610(0) in the index look-up table (the index RRT1 and the corresponding read voltage levels of 14V and 23V as shown in Table 3) associated with the upper physical programming unit, and records the read voltage level c2 of the lower physical programming unit in the index look-up table (the index RRT1 and the corresponding read voltage level of 5V as shown in Table 4) associated with the lower physical programming unit. Reference may be made to the above for the recording manners of other physical units and the read voltage level groups thereof in Table 2, which will not be repeated.

According to Table 2, the index corresponding to the physical unit 610(0) is RRT1. The memory management circuit 502 inputs the index RRT1 into Table 3 when reading the upper physical programming unit of the physical unit 610(0) to obtain that the read voltage level c1 is 14V and the read voltage level c3 is 23V. In addition, the memory management circuit 502 inputs the index RRT1 into Table 4 when reading the lower physical programming unit of the physical unit 610(0) to obtain that the read voltage level c2 is 5V. The optimal read voltage levels of other physical units may be queried in the same manner as above, which will not be repeated.

It is worth noting that according to Table 2, the index corresponding to the physical unit 610(4) is RRT3, which means that the physical unit 610(4) and the physical unit 610(2) are of the same read voltage level group, that is, multiple physical units may correspond to the same index. Storage space can be saved by assigning the index to the physical units of the same read voltage level group.

In an exemplary embodiment, it is assumed that the rewritable non-volatile memory module 406 is the TLC NAND flash memory module. When the physical units included in the TLC NAND flash memory module are stored with data, each physical unit corresponds to seven threshold voltages. Specifically, each memory cell of the TLC NAND flash memory module may store 3 bits, and the physical programming units on the same word line may be classified into at least the lower physical programming unit, a middle physical programming unit, and the upper physical programming unit. In the exemplary embodiment, the lower physical programming unit corresponds to two of the seven threshold voltages, the middle physical programming unit corresponds to three of the seven threshold voltages, and the upper physical programming unit corresponds to two of the seven threshold voltages. Therefore, when the rewritable non-volatile memory module 406 is the TLC NAND flash memory module, the memory management circuit 502 records seven read voltage levels for each physical unit.

For example, Table 5 below is an example of the physical unit index comparison table in an exemplary embodiment, which is used to record the corresponding relationship between the physical unit and the index. Table 6 below is an example of the index look-up table in an exemplary embodiment, which is used to record the corresponding relationship between the index and the read voltage level of the upper physical programming unit. Table 7 below is an example of the index look-up table in an exemplary embodiment, which is used to record a corresponding relationship between the index and the read voltage level of the middle physical programming unit. Table 8 below is an example of the index look-up table in an exemplary embodiment, which is used to record the corresponding relationship between the index and the read voltage level of the lower physical programming unit.

TABLE 5

| Physical unit | Index |
|---|---|
| 610(0) | RRT1 |
| 610(1) | RRT2 |
| 610(2) | RRT3 |
| 610(3) | RRT4 |

TABLE 6

| Index | Read voltage level c1 | Read voltage level c5 |
|---|---|---|
| RRT1 | 6 V | 12 V |
| RRT2 | 15 V | 18 V |
| RRT3 | −2 V | 7 V |
| RRT4 | −5 V | −4 V |

TABLE 7

| Index | Read voltage level c2 | Read voltage level c4 | Read voltage level c6 |
|---|---|---|---|
| RRT1 | 9 V | 11 V | 13 V |
| RRT2 | 16 V | 21 V | 27 V |
| RRT3 | 1 V | 6 V | 10 V |
| RRT4 | −1 V | 6 V | 12 V |

TABLE 8

| Index | Read voltage level c3 | Read voltage level c7 |
|---|---|---|
| RRT1 | 11 V | 18 V |
| RRT2 | 10 V | 16 V |
| RRT3 | −4 V | −1 V |
| RRT4 | −8 V | −4 V |

Specifically, the memory management circuit 502 may assign the index RRT1 to the physical unit 610(0) when recording the read voltage level group of the physical unit 610(0). The memory management circuit 502 records the index RRT1 corresponding to the physical unit 610(0) in the physical unit index comparison table (the physical unit 610(0) and the corresponding index RRT1 shown in Table 5), records the read voltage levels c1 and c5 of the upper physical programming unit of the physical unit 610(0) in the index look-up table (the index RRT1 and the corresponding 6V and 12V as shown in Table 6) associated with the upper physical programming unit, records the read voltage levels c2, c4, and c6 of the middle physical programming unit in the index look-up table (the index RRT1 and the corresponding 9V, 11V, and 13V as shown in Table 7) associated with the middle physical programming unit, and records the read voltage levels c3 and c7 of the lower physical programming unit in the index look-up table (the index RRT1 and the corresponding 11V and 18V shown in Table 8) associated with the lower physical programming unit. Reference may be made to the above for the recording manners of other physical units and the read voltage level groups thereof in Table 5, which will not be repeated here.

In the exemplary embodiment, the memory management circuit 502 may record the association information between the first index corresponding to the first read voltage level and the second index corresponding to the second read voltage level in the transient look-up table. The association information includes the count value of the number of times that the first index and the second index are associated. Specifically, the memory management circuit 502 may count the number of times that the first index and the second index are associated to generate the count value, and record the count value in the transient look-up table. For example, Table 9 below is the transient look-up table in an exemplary embodiment, which records the association information between the first index and the second index.

TABLE 9

| Index | RRT1 | RRT2 | RRT3 | RRT4 |
|---|---|---|---|---|
| RRT1 | 0 | 0 | 0 | 0 |
| RRT2 | 0 | 0 | 0 | 0 |
| RRT3 | 1 | 0 | 0 | 0 |
| RRT4 | 0 | 0 | 0 | 0 |

It is assumed that the memory management circuit 502 performs the data read operation on the upper physical programming unit of the physical unit 610(0) of Table 5. According to Table 5, the memory management circuit 502 uses the read voltage levels 6V and 12V corresponding to the index RTT1 as the initial read voltage levels to perform the data read operation on the upper physical programming unit of the physical unit 610(0), and it is assumed that the read voltage levels used to successfully read the physical unit 610(0) are the read voltage levels of −2V and 7V corresponding to the index RTT3. In the exemplary embodiment, the memory management circuit 502 counts the number of times that the index RTT1 and the index RTT3 are associated to generate the count value. For example, the count value recorded in the field corresponding to the index RTT1 and the index RTT3 in Table 9 is 1, which means that the number of times that the index RTT1 and the index RTT3 are associated is once. However, Table 9 is only an example, and specific records may be adjusted according to practical requirements.

It is worth noting that if the second read voltage level used to successfully read the physical unit is different from the read voltage level corresponding to any index, the memory management circuit 502 will calculate a distance between the second read voltage level and the read voltage level corresponding to each index. In addition, the memory management circuit 502 will record the associate information between the calculated nearest read voltage level (or the corresponding index thereof) and the first read voltage level (or the corresponding index thereof) in the transient look-up table.

In an exemplary embodiment, the memory management circuit 502 may determine the initial read voltage level used when performing the data read operation according to a read level tracking table. The read level tracking table records the optimal read voltage level of each physical unit. Specifically, the memory management circuit 502 may obtain the optimal read voltage level (also referred to as a first optimal read voltage level) corresponding to the first physical unit from the read level tracking table as the initial read voltage level. For example, the read level tracking table may include Tables 2 to 4 above or Tables 5 to 8 above. Taking Tables 2 to 4 above as examples, the memory management circuit 502 may input the index RRT1 into Table 3 when reading the upper physical programming unit of the physical unit 610(0) to obtain the read voltage levels of 14V and 23V as the initial read voltage levels.

In an exemplary embodiment, if there is the transient look-up table recorded with the association information in the memory storage device 10, the memory management circuit 502 may determine the initial read voltage level used when performing the data read operation according to the read level tracking table and the association information recorded in the transient look-up table. Specifically, the memory management circuit 502 may obtain the optimal read voltage level of the physical unit from the read level tracking table according to the physical unit to be read. For example, the memory management circuit 502 may obtain the first optimal read voltage level of the first physical unit from the read level tracking table according to the first physical unit to be read (for example, a second physical unit in other embodiments). In addition, the memory management circuit 502 looks up the transient look-up table according to the first optimal read voltage level (or the corresponding first index) to sequentially obtain the second read voltage level (or the read voltage level corresponding to the second index) corresponding to the count value as the initial read voltage level according to a sequence of multiple count values from large to small. Then, the memory management circuit 502 may perform the data read operation according to the initial read voltage level.

For example, Table 10 below is the transient look-up table in an exemplary embodiment, which records the association information between the first index and the second index. In the exemplary embodiment, the memory management circuit 502 records the operation results, including 1840 pieces of association information, after performing the data read operation 1840 times in the transient look-up table.

TABLE 10

| Index | RRT1 | RRT2 | RRT3 | RRT4 |
|---|---|---|---|---|
| RRT1 | 0 | 0 | 100 | 100 |
| RRT2 | 10 | 300 | 200 | 0 |
| RRT3 | 1000 | 500 | 0 | 20 |
| RRT4 | 0 | 30 | 0 | 300 |

In Table 10, the field with a count value of 500 indicates that when the read voltage level corresponding to the index RTT2 (that is, the first read voltage level) is used as the initial read voltage level to perform the data read operation on the physical unit, the number of times of obtaining the read voltage level (that is, the second read voltage level) corresponding to the index RTT3 used to successfully read the physical unit is 500 times. The content recorded in other fields is analogous. In the exemplary embodiment, it is assumed that when performing the data read operation, the data stored in the upper physical programming unit of the physical unit 610(1) needs to be decoded. According to Table 2 above, the index corresponding to the physical unit 610(1) is "RRT2". The memory management circuit 502 looks up the transient look-up table shown in Table 10 according to the index RRT2 to obtain the read voltage level corresponding to the index RRT3 corresponding to the maximum count value (that is, 500) among multiple count values corresponding to the indexes RRT1, RRT2, RRT3, and RRT4 corresponding to the index RRT2 as the initial read voltage level. For example, the memory management circuit 502 may obtain the read voltage levels of −2V and 4V as the initial read voltage levels by looking up the index look-up table shown in Table 3 according to the index RRT3 to perform the data read operation. In addition, if the decoding fails in the data read operation, the memory management circuit 502 may obtain the read voltage level corresponding to the index RRT2 corresponding to the maximum count value (that is, 300) among multiple count values corresponding to the other indexes RRT1, RRT2, and RRT4 as the initial read voltage level, and so on.

In other words, the memory management circuit 502 further fine-tunes the previously tracked optimal read voltage level according to the transient look-up table when the association information is recorded in the transient look-up table. Even if the current operating and environmental conditions when the memory storage device 10 actually reads the data are different from the conditions when previously monitoring the optimal read voltage level or the optimal read voltage level shifts due to an excessively long interval between the actual data reading time and the previous monitoring time, the memory management circuit 502 may still predict the read voltage level that is currently closer to the actual optimal read voltage level according to a voltage level shift change collated in the transient look-up table to perform the subsequent data read operation. In this way, the efficacy of the read operation can be improved.

In an exemplary embodiment, the memory management circuit 502 may update the read level tracking table according to the association information recorded in the transient look-up table, and clear the transient look-up table after updating the read level tracking table. For example, after the total number of count values recorded in the transient look-up table reaches a preset recording threshold (for example, 10000), the memory management circuit 502 may update the optimal read voltage level recorded in the read level tracking table according to the transient look-up table. In addition, the memory management circuit 502 may also update the optimal read voltage level recorded in the read level tracking table according to the transient look-up table when the memory storage device 10 is powered on again after being powered off. The disclosure does not limit the timing of updating the read level tracking table according to the transient look-up table.

In the exemplary embodiment, the memory management circuit 502 may look up the transient table according to the optimal read voltage level (also referred to as a third optimal read voltage level) in the read level tracking table, and obtain the second read voltage level corresponding to the maximum count value according to the maximum count value among multiple count values corresponding to the first read voltage level corresponding to the third optimal read voltage level. In addition, the third optimal read voltage level in the read level tracking table is updated to the second read voltage level.

For example, it is assumed that the memory management circuit 502 updates the read level tracking tables including Tables 2 to 4 according to the transient look-up table of Table 10 above. According to Table 10 above, the index corresponding to the largest count value among multiple count values corresponding to the index RRT2 is the index RRT3. Therefore, the memory management circuit 502 may update the index RRT2 corresponding to the physical unit 610(1) in Table 2 to the index RRT3. Reference may be made to, for example, Table 11 below for the update result.

TABLE 11

| Physical unit | Index |
| --- | --- |
| 610(0) | RRT1 |
| 610(1) | RRT3 |

TABLE 11-continued

| Physical unit | Index |
| --- | --- |
| 610(2) | RRT3 |
| 610(3) | RRT4 |
| 610(4) | RRT3 |

Figure 7:
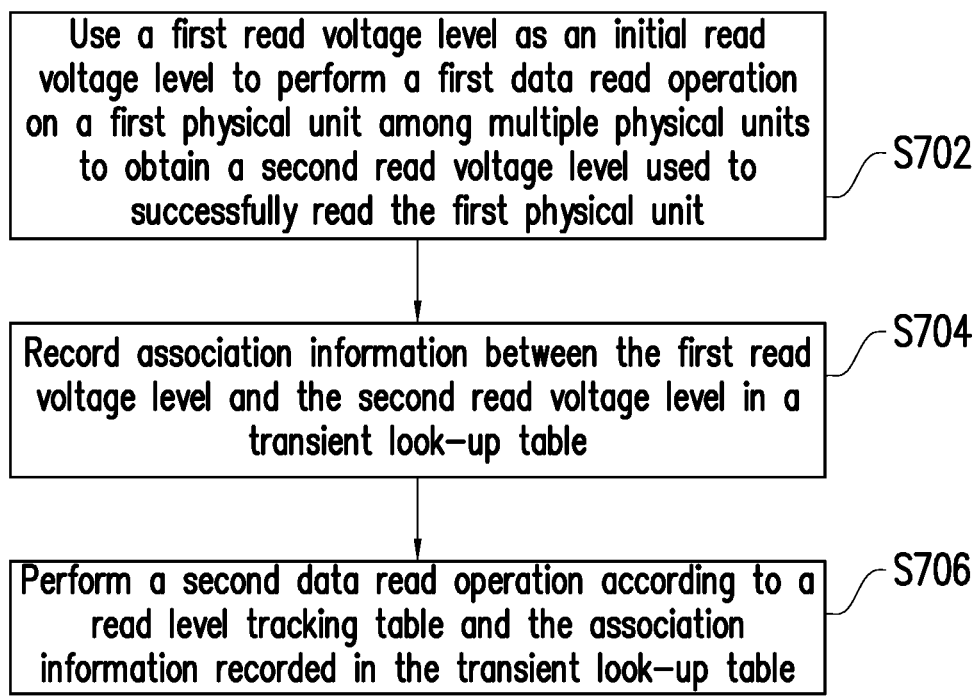
FIG. 7 is a flowchart of a read voltage level correction method according to an exemplary embodiment of the disclosure.

FIG. 7 is a flowchart of a read voltage level correction method according to an exemplary embodiment of the disclosure. Please refer to FIG. 7. In Step S702, the memory management circuit 502 uses the first read voltage level as the initial read voltage level to perform the first data read operation on the first physical unit among multiple physical units to obtain the second read voltage level used to successfully read the first physical unit. In Step S704, the memory management circuit 502 records the association information between the first read voltage level and the second read voltage level in the transient look-up table. In Step S706, the memory management circuit 502 performs the second data read operation according to the read level tracking table and the association information recorded in the transient look-up table.

Figure 8:
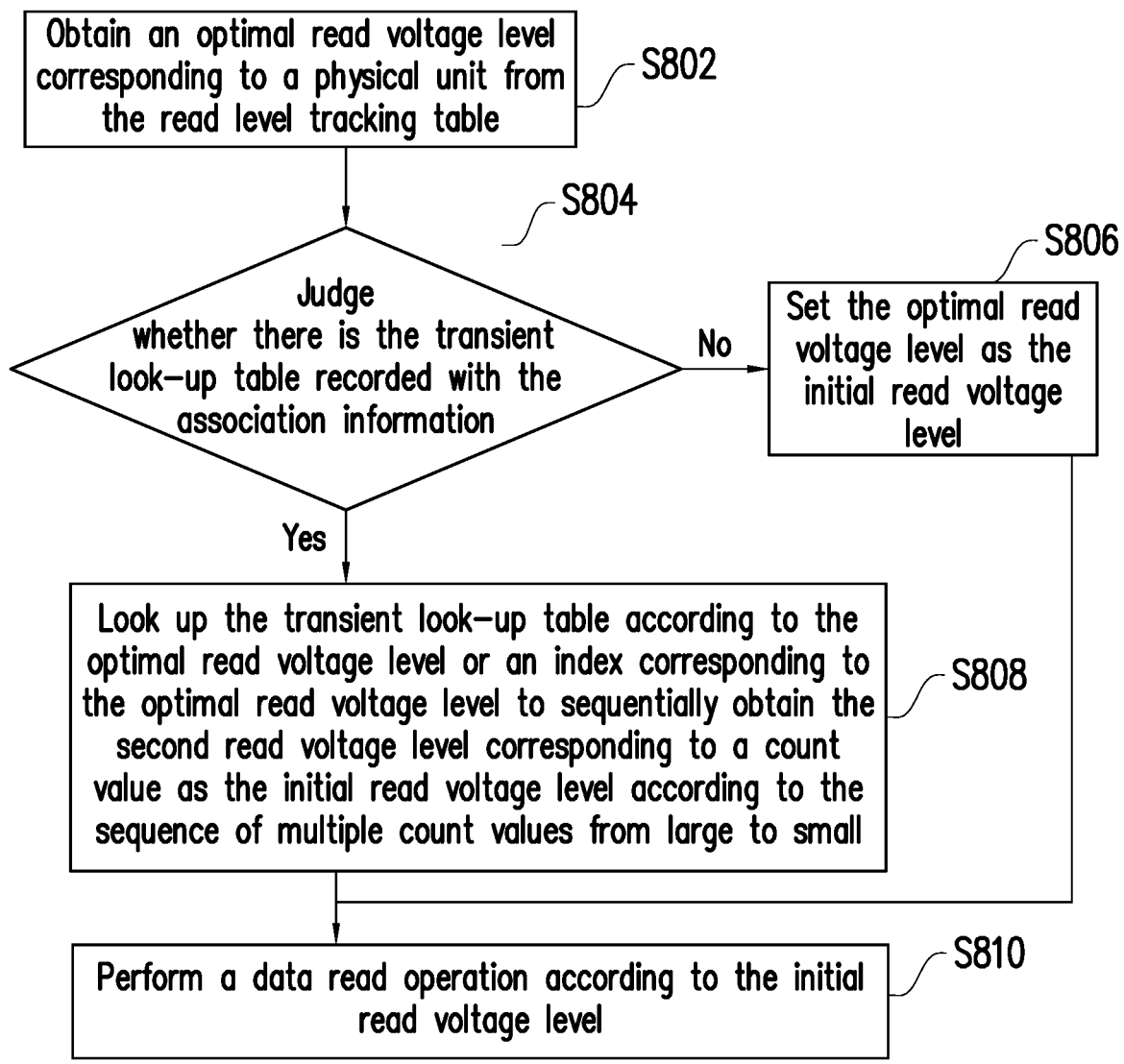
FIG. 8 is a flowchart of a method for updating an optimal read voltage level according to an exemplary embodiment of the disclosure.

FIG. 8 is a flowchart of a method for updating an optimal read voltage level according to an exemplary embodiment of the disclosure. In Step S802, the memory management circuit 502 obtains the optimal read voltage level corresponding to the physical unit from the read level tracking table. In Step S804, the memory management circuit 502 judges whether there is the transient look-up table recorded with the association information. In Step S806, if it is judged that there is no transient look-up table recorded with the association information (that is, the judgment of Step S804 is "No"), the memory management circuit 502 sets the optimal read voltage level as the initial read voltage level. In Step S808, if it is judged that there is the transient look-up table recorded with the association information (that is, the judgment of Step S804 is "Yes"), the memory management circuit 502 looks up the transient look-up table according to the optimal read voltage level or the index corresponding to the optimal read voltage level to sequentially obtain the second read voltage level corresponding to the count value as the initial read voltage level according to the sequence of multiple count values from large to small. In Step S810, the memory management circuit 502 performs the data read operation according to the initial read voltage level.

However, each step in FIG. 7 and FIG. 8 has been described in detail as above, which will not be repeated. It should be noted that each step in FIG. 7 and FIG. 8 may be implemented as multiple program codes or circuits, which is not limited in the disclosure. In addition, the methods of FIG. 7 and FIG. 8 may be used in conjunction with the above exemplary embodiments and may also be used alone, which is not limited in the disclosure.

In summary, in the read voltage level correction method, the memory storage device, and the memory control circuit unit provided by the embodiments of the disclosure, the association information can be recorded in the transient look-up table, and the previously monitored optimal read voltage level can be fine-tuned according to the association information recorded in the transient look-up table. In this way, even if the current operating and environmental conditions when the memory storage device actually reads the data are different from the conditions when previously monitoring the optimal read voltage level or the optimal read voltage level shifts due to an excessively long interval between the actual data reading time and the previous monitoring time, the memory management circuit may still predict the read voltage level that is currently closer to the actual optimal read voltage level according to the voltage level shift change collated in the transient look-up table to perform the subsequent data read operation. Therefore, the disclosure can improve the efficiency of finding the actual optimal read voltage level and improve the accuracy of the found optimal read voltage level. Compared with generally only using the previously monitored optimal read voltage level to perform operations such as the optimal read level search operation and the decoding operation, the disclosure can reduce the time for finding the read voltage level that may successfully read the physical unit, thereby increasing the overall efficacy of the data read operation.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A read voltage level correction method for a rewritable non-volatile memory module, wherein the rewritable non-volatile memory module comprises a plurality of physical units, comprising:
   using a first read voltage level as an initial read voltage level to perform a first data read operation on a first physical unit among the physical units to obtain a second read voltage level used to successfully read the first physical unit;
   recording association information between the first read voltage level and the second read voltage level in a transient look-up table;
   performing a second data read operation according to a read level tracking table and the association information recorded in the transient look-up table, wherein
   the read level tracking table records a plurality of optimal read voltage levels of the physical units, wherein the plurality of optimal read voltage levels are the read voltage levels which are used to read the data of the physical unit and decode successfully, and
   wherein the step of recording the association information between the first read voltage level and the second read voltage level in the transient look-up table comprises: counting a number of times that the first read voltage level and the second read voltage level are associated to generate a count value; and recording the count value in the transient look-up table.

2. The read voltage level correction method according to claim 1, wherein the step of using the first read voltage level as the initial read voltage level to perform the first data read operation on the first physical unit among the physical units further comprises:
   obtaining a first optimal read voltage level corresponding to the first physical unit from the read level tracking table as the first read voltage level.

3. The read voltage level correction method according to claim 1, wherein the step of using the first read voltage level as the initial read voltage level to perform the first data read operation on the first physical unit among the physical units further comprises:
   determining the first read voltage level according to the read level tracking table and the association information recorded in the transient look-up table.

4. The read voltage level correction method according to claim 1, comprising:
   performing a decoding operation when using the first read voltage level as the initial read voltage level to perform the first data read operation on the first physical unit among the physical units or performing the second data read operation according to the read level tracking table and the association information recorded in the transient look-up table.

5. The read voltage level correction method according to claim 1, wherein the step of performing the second data read operation according to the read level tracking table and the association information recorded in the transient look-up table comprises: when the second data read operation instructs to read data of a second physical unit among the physical units, obtaining a second optimal read voltage level of the second physical unit from the read level tracking table; and
   looking up the transient look-up table according to the second optimal read voltage level or an index corresponding to the second optimal read voltage level to sequentially obtain the second read voltage level corresponding to the count value as an initial read voltage level for performing the second data read operation according to a sequence of a plurality of count values from large to small.

6. The read voltage level correction method according to claim 1, further comprising:
   updating the read level tracking table according to the association information recorded in the transient look-up table; and
   clearing the transient look-up table after updating the read level tracking table.

7. A memory storage device, comprising:
   a connection interface unit, configured to couple to a host system;
   a rewritable non-volatile memory module, comprising a plurality of physical units; and
   a memory control circuit unit, coupled to the connection interface unit and
   the rewritable non-volatile memory module, wherein
   the memory control circuit unit is configured to use a first read voltage level as an initial read voltage level to perform a first data read operation on a first physical unit among the physical units to obtain a second read voltage level used to successfully read the first physical unit,
   the memory control circuit unit is further configured to record association information between the first read voltage level and the second read voltage level in a transient look-up table,
   the memory control circuit unit is further configured to perform a second data read operation according to a read level tracking table and the association information recorded in the transient look-up table, wherein
   the read level tracking table records a plurality of optimal read voltage levels of the physical units, wherein the plurality of optimal read voltage levels are the read voltage levels which are used to read the data of the physical unit and decode successfully, and
   wherein in the operation of recording the association information between the first read voltage level and the second read voltage level in the transient look-up table, the memory control circuit unit is further configured to count a number of times that the first read voltage level and the second read voltage level are associated to generate a count value, and the memory control circuit unit is further configured to record the count value in the transient look-up table.

8. The memory storage device according to claim 7, wherein the memory control circuit unit is further configured to obtain a first optimal read voltage level corresponding to the first physical unit from the read level tracking table as the first read voltage level.

9. The memory storage device according to claim 7, wherein the memory control circuit unit is further configured to determine the first read voltage level according to the read level tracking table and the association information recorded in the transient look-up table.

10. The memory storage device according to claim 7, wherein the memory control circuit unit is further configured to perform a decoding operation when using the first read voltage level as the initial read voltage level to perform the first data read operation on the first physical unit among the physical units or performing the second data read operation according to the read level tracking table and the association information recorded in the transient look-up table.

11. The memory storage device according to claim 7, wherein in the operation of performing the second data read operation according to the read level tracking table and the association information recorded in the transient look-up table,
the memory control circuit unit is further configured to obtain a second optimal read voltage level of a second physical unit among the physical units from the read level tracking table when the second data read operation instructs to read data of the second physical unit, and
the memory control circuit unit is further configured to look up the transient look-up table according to the second optimal read voltage level or an index corresponding to the second optimal read voltage level to sequentially obtain the second read voltage level corresponding to the count value as an initial read voltage level for performing the second data read operation according to a sequence of a plurality of count values from large to small.

12. The memory storage device according to claim 7, wherein the memory control circuit unit is further configured to update the read level tracking table according to the association information recorded in the transient look-up table, and
the memory control circuit unit is further configured to clear the transient look-up table after updating the read level tracking table.

13. A memory control circuit unit, configured to control a rewritable non-volatile memory module comprising a plurality of physical units, wherein the memory control circuit unit comprises:
a host interface, configured to couple to a host system;
a memory interface, configured to couple to the rewritable non-volatile memory module;
an error detecting and correcting circuit; and
a memory management circuit, coupled to the host interface, the memory interface, and the error detecting and correcting circuit, wherein
the memory management circuit is configured to use a first read voltage level as an initial read voltage level to perform a first data read operation on a first physical unit among the physical units to obtain a second read voltage level used to successfully read the first physical unit,
the memory management circuit is further configured to record association information between the first read voltage level and the second read voltage level in a transient look-up table,
the memory management circuit is further configured to perform a second data read operation according to a read level tracking table and the association information recorded in the transient look-up table,
wherein the read level tracking table records a plurality of optimal read voltage levels of the physical units, wherein the plurality of optimal read voltage levels are the read voltage levels which are used to read the data of the physical unit and decode successfully, and
wherein in the operation of recording the association information between the first read voltage level and the second read voltage level in the transient look-up table,
the memory management circuit is further configured to count a number of times that the first read voltage level and the second read voltage level are associated to generate a count value, and
the memory management circuit is further configured to record the count value in the transient look-up table.

14. The memory control circuit unit according to claim 13, wherein the memory management circuit is further configured to obtain a first optimal read voltage level corresponding to the first physical unit from the read level tracking table as the first read voltage level.

15. The memory control circuit unit according to claim 13, wherein the memory management circuit is further configured to determine the first read voltage level according to the read level tracking table and the association information recorded in the transient look-up table.

16. The memory control circuit unit according to claim 13, wherein the memory management circuit is further configured to perform a decoding operation when using the first read voltage level as the initial read voltage level to perform the first data read operation on the first physical unit among the physical units or performing the second data read operation according to the read level tracking table and the association information recorded in the transient look-up table.

17. The memory control circuit unit according to claim 13, wherein in the operation of performing the second data read operation according to the read level tracking table and the association information recorded in the transient look-up table,
the memory management circuit is further configured to obtain a second optimal read voltage level of a second physical unit among the physical units from the read level tracking table when the second data read operation instructs to read data of the second physical unit, and
the memory management circuit is further configured to look up the transient look-up table according to the second optimal read voltage level or an index corresponding to the second optimal read voltage level to sequentially obtain the second read voltage level corresponding to the count value as an initial read voltage level for performing the second data read operation according to a sequence of a plurality of count values from large to small.

18. The memory control circuit unit according to claim 13, wherein the memory management circuit is further configured to update the read level tracking table according to the association information recorded in the transient look-up table, and
the memory management circuit is further configured to clear the transient look-up table after updating the read level tracking table.

* * * * *